United States Patent
Goel et al.

(10) Patent No.: US 9,513,332 B2
(45) Date of Patent: Dec. 6, 2016

(54) PROBE CARD PARTITION SCHEME

(71) Applicant: TAIWAN SEMICONDUCTOR MANUFACTURING COMPANY, LTD., Hsinchu (TW)

(72) Inventors: Sandeep Kumar Goel, San Jose, CA (US); Mill-Jer Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 82 days.

(21) Appl. No.: 14/459,801

(22) Filed: Aug. 14, 2014

(65) Prior Publication Data

US 2014/0354322 A1 Dec. 4, 2014

Related U.S. Application Data (63) Continuation of application No. 13/273,633, filed on Oct. 14, 2011, now Pat. No. 8,836,363.

(51) Int. Cl.
| | | |
|---|---|---|
| G01R 31/00 | (2006.01) | |
| G01R 31/28 | (2006.01) | |
| G01R 1/04 | (2006.01) | |
| G01R 1/073 | (2006.01) | |
| G01R 31/319 | (2006.01) | |

(52) U.S. Cl.
CPC ......... G01R 31/2889 (2013.01); G01R 1/0408 (2013.01); G01R 1/07342 (2013.01); *G01R 31/31908* (2013.01)

(58) Field of Classification Search
CPC ............ G01R 1/0408; G01R 31/2889; G01R 31/31908; G01R 1/07342
USPC ............ 324/756.03, 762.01–762.04, 754.01, 324/754.03, 754.08
See application file for complete search history.

(56) References Cited

U.S. PATENT DOCUMENTS

| | | | |
|---|---|---|---|
| 5,124,646 A | | 6/1992 | Shiraishi |
| 5,525,912 A | | 6/1996 | Momohara |
| 5,616,931 A | * | 4/1997 | Nakamura .......... H01L 21/3043 257/48 |
| 5,736,850 A | * | 4/1998 | Legal ............... G01R 31/31905 324/754.07 |
| 5,818,249 A | | 10/1998 | Momohara |
| 5,912,502 A | * | 6/1999 | Kano ................. G01R 31/2884 257/207 |
| 5,959,461 A | * | 9/1999 | Brown ..................... G01R 1/04 324/750.2 |
| 6,639,420 B1 | * | 10/2003 | Chen .................. G01R 31/2886 324/754.03 |
| 7,459,925 B1 | | 12/2008 | Wu |

(Continued)

FOREIGN PATENT DOCUMENTS

| | | |
|---|---|---|
| CN | 101889338 | 11/2010 |
| JP | 02119235 A * | 5/1990 |
| JP | 2005136302 | 5/2005 |

*Primary Examiner* — Patrick Assouad
*Assistant Examiner* — Demetrius Pretlow
(74) *Attorney, Agent, or Firm* — Hauptman Ham, LLP (57) ABSTRACT

A method of testing an integrated circuit die comprises partitioning a first probe card partition layout of the integrated circuit die having one or more sections comprising a first quantity of section types into a second probe card partition layout having a greater quantity of sections comprising a second quantity of section types, the second quantity of section types being less than the first quantity of section types. The method also comprises using one or more probe cards to test the sections in the second probe card partition layout, each of the one or more probe cards having a test contact pattern that corresponds with a test contact pattern of one of each section type included in the second probe card partition layout.

16 Claims, 7 Drawing Sheets

(56) References Cited

U.S. PATENT DOCUMENTS

| | | | | |
|---|---|---|---|---|
| 7,535,239 B1* | 5/2009 | Dang | G01R 1/07378 | 324/756.03 |
| 8,241,926 B2* | 8/2012 | Yoshikawa | G01R 31/2896 | 324/756.03 |
| 8,248,091 B2* | 8/2012 | Cheng | G01R 1/07371 | 324/754.07 |
| 2005/0277323 A1 | 12/2005 | Eldridge et al. | | |
| 2006/0066329 A1* | 3/2006 | Cheng | G01R 31/2889 | 324/754.07 |
| 2006/0279003 A1* | 12/2006 | Maruyama | H01L 22/32 | 257/797 |
| 2007/0210817 A1* | 9/2007 | Dabit | G01R 1/07342 | 257/48 |
| 2011/0018568 A1* | 1/2011 | Chen | G01R 31/2889 | 324/756.03 |
| 2012/0025397 A1* | 2/2012 | Miller | H01L 23/50 | 257/777 |

* cited by examiner

PROBE CARD PARTITION SCHEME

PRIORITY CLAIM

The present application is a continuation of U.S. application Ser. No. 13/273,633, filed Oct. 14, 2011, now U.S. Pat. No. 8,836,363, which is incorporated herein by reference in its entirety.

TECHNICAL FIELD

The present disclosure relates generally to an integrated circuit test and, more particularly, to a probe card.

BACKGROUND

More integrated circuit (IC) devices have higher pin counts for more advanced applications. Many conventional ICs, as well as 3-dimensional (3D) or 2.5D ICs, have a large number of pins. For testing ICs with high pin counts, a tester pin count limit constrains the testing of the ICs. Also, customized probe cards for the IC testing can be very expensive. If a tester pin count is less than the pin count of the tested IC, multiple insertions of the IC wafer for testing using multiple probe cards may be necessary, which increases the testing time and cost.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figures 1A, 1B, 1C:
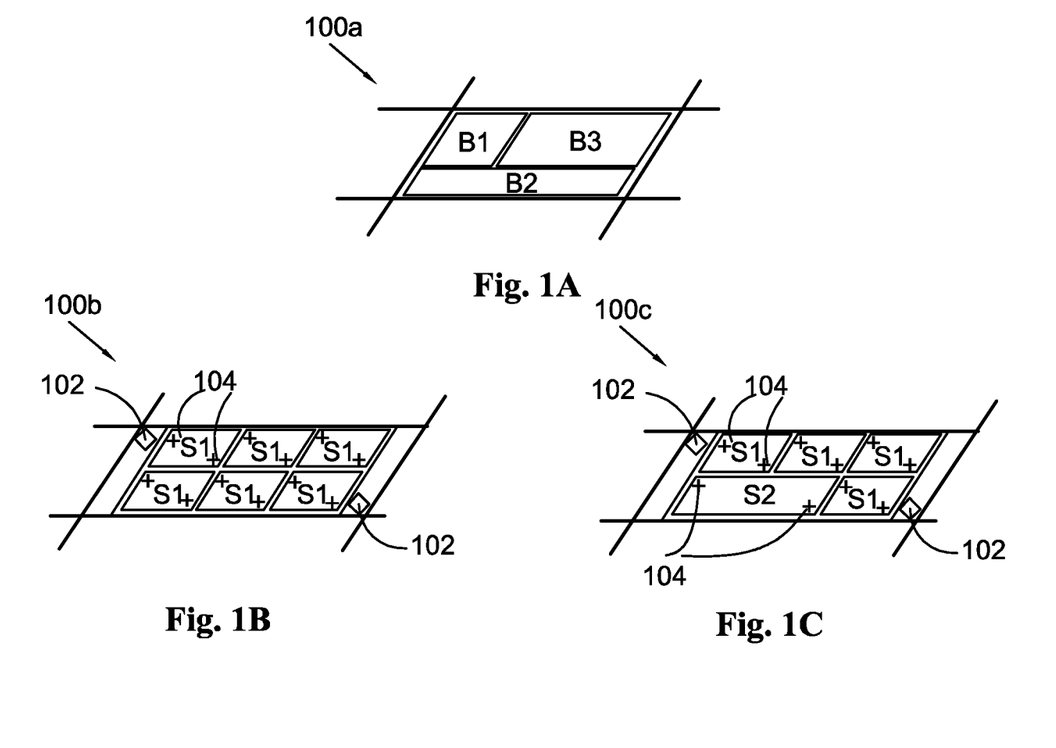
FIG. 1A is an exemplary probe card partition layout for an integrated circuit die that can be repartitioned for probe card reuse.
FIG. 1B is an exemplary probe card partition layout repartitioned from the layout of FIG. 1A for probe card reuse according to some embodiments.
FIG. 1C is another exemplary probe card partition layout repartitioned from the layout of FIG. 1A for probe card reuse according to some embodiments.

FIG. 1A is an exemplary probe card partition layout for an integrated circuit die that can be repartitioned for probe card reuse. The probe card partition layout 100a includes sections B1, B2, and B3. The three sections B1, B2, and B3 have different shapes and areas. Therefore, each section requires a different probe card. The integrated circuit die testing with probe card partition layout 100a would have 3 probe cards, 3 wafer insertions (to the prober equipment), and 3 probing steps.

FIG. 1B is an exemplary probe card partition layout repartitioned (re-layout) from the layout of FIG. 1A for probe card reuse according to some embodiments. The probe card partition layout 100b includes (partition) sections S1. Each section S1 is repeated 6 times to cover the same integrated circuit die area as the three sections B1, B2, and B3 in FIG. 1A. Each section S1 has the same test contact patterns (e.g., pad pattern) for a probe card. (Test contacts or pads on an integrated circuit comprise electrically conductive material such as metal and provide electrical contact points for the probe card.)

For testing, die-level alignment marks 102 are used to align the integrated circuit die and section-level alignment marks 104 are used to align the sections S1 with the probe card. The number of test contacts of each partition S1 of the probe card partition layout 100b is limited within a tester pin count specification.

Repartitioning of the testing area helps to keep testing pin counts within a specified tester pin count limit, and enables efficient wafer-level testing for large pin count devices by reusing the same probe card multiple times. For the repartition, dummy pads may be added to provide uniform sections. For example, some integrated circuit area in the six sections S1 in FIG. 1B can include dummy patterns to provide uniform probe card interface to reuse the same probe card for the sections S1. An illustrative example of dummy pads is described further in FIGS. 4A-4B.

Also, the test contacts (such as pads or -bumps) of each probe card partition section may be limited within the tester pin count. Reducing the number of distinct probe card partition sections results in cost reduction. For example, the three distinct probe card partition section B1, B2, and B3 in FIG. 1A are reduced to one probe card partition section S1 (reused six times) in FIG. 1B.

The integrated circuit die testing with probe card partition layout 100*b* would have 1 probe card, 1 wafer insertion (to the prober equipment), and 6 probing steps (reusing one probe card six times). The 6 probing steps include moving and aligning the probe card and the integrated circuit die for each section S1. Since the probe card cost is relatively large, the probe card partition layout 100*b* reusing 1 probe card for multiple sections S1 can save costs compared to the probe card partition layout 100*a* that requires 3 probe cards.

FIG. 1C is another exemplary probe card partition layout repartitioned from the layout of FIG. 1A for probe card reuse according to some embodiments. The probe card partition layout 100*c* includes multiple sections S1 and S2. The section S2 with different size from the section S1 is used in this example because the integrated circuit included in section S2 cannot be tested properly if divided into sections S1 as shown in FIG. 1B. In some embodiments, the area of section S2 is multiple times (e.g., 2 times) of the area of section S1.

Each probe card partition section such as S1 and S2 in FIG. 1C has a specified testing interface. For example, each probe card partition section has a different test contact pattern (layout) for electrical contacts, which includes different locations or incompatible pin types, such as power, ground, or signal. Each probe card partition section such as S1 and S2 in FIG. 1C has specified alignment marks 104 for testing alignment. The number of test contacts of each partition S1 or S2 of the probe card partition layout 100*c* is limited within a tester pin count specification limit.

The integrated circuit die testing with probe card partition layout 100*c* would have 2 probe cards, 2 time wafer insertion (to the prober equipment), and 5 probing steps (reusing one probe card for the section S1 four times and another probe card for the section S2 one time). The five probing steps include moving and aligning the probe card and the integrated circuit die four times for each section S1. Since the probe card cost is relatively large, the probe card partition layout 100*c* with 2 probe cards (reusing 1 probe card for multiple sections S1) can save costs compared to the probe card partition layout 100*a* that requires 3 probe cards.

By using the probe card reuse scheme as described above, high pin count IC testing can be performed with a reduced number of probe cards with less manufacturing costs. Also, the wafer insertion time, e.g., loading and preheat, is reduced due to the reduced number of probe cards. Even though FIG. 1B and FIG. 1C illustrate two examples of probe card partition layouts, there can be many different partition layouts depending on the tested integrated circuit, probe card size, cost, etc.

Figure 2A:
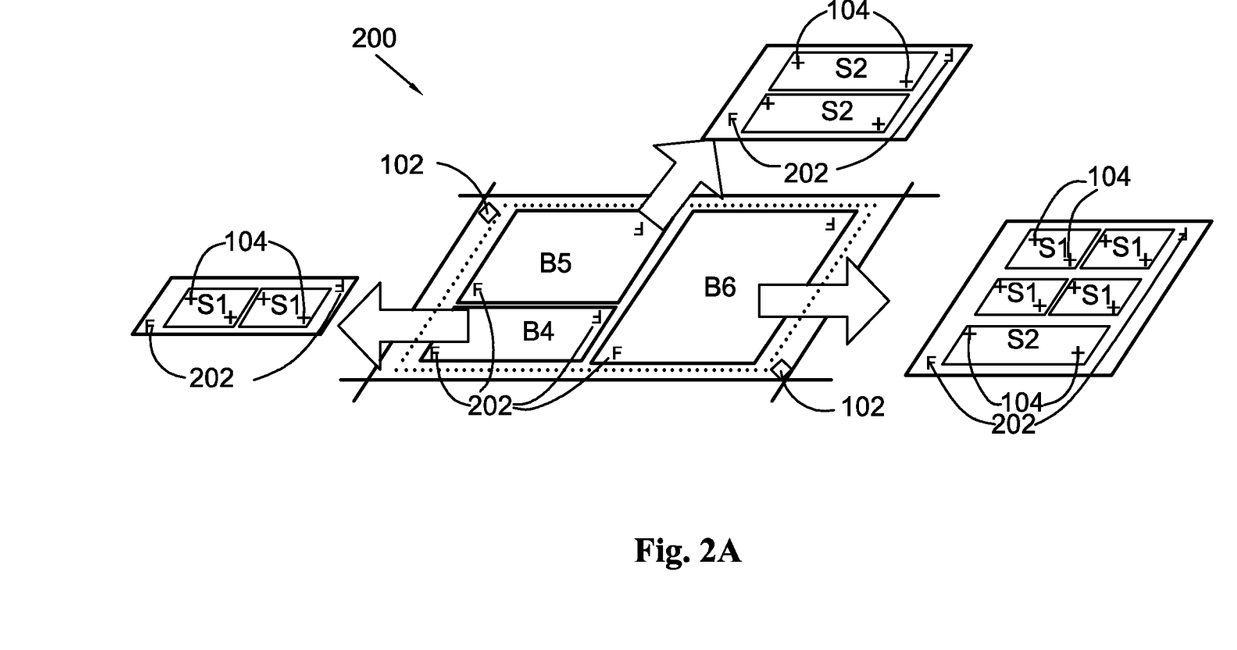
FIG. 2A is another probe card partition layout of an integrated circuit die repartitioned for probe card reuse according to some embodiments.

FIG. 2A is another probe card partition layout of an integrated circuit die repartitioned for probe card reuse according to some embodiments. The probe card partition layout 200 includes sections B4, B5, and B6, having alignment marks 202 for testing alignment. The three sections B4, B5, and B6 have different shapes and areas. The die-level alignment marks 102 and section-level alignment marks 202 are used for testing alignment. Without repartitioning of the probe card partition layout, each section requires a different probe card. The integrated circuit die testing with the probe card partition layout 200 would have 3 probe cards, 3 wafer insertions (to the prober equipment), and 3 probing steps.

For repartition, the section B4 is divided into two sections S1, the section B5 is divided into two sections S2, the section B6 is divided into four sections S1 and one section S2. Each section has alignment marks 104 for testing alignment. After the repartition using sections S1 and S2, the integrated circuit die testing with repartitioned probe card partition layout would have 2 probe cards, 2 wafer insertions (to the prober equipment), and 9 probing steps (reusing one probe card for the section S1 six times and another probe card for the section S2 three times). After the repartition, testing cost is reduced because the repartitioned probe card partition layout only uses 2 probe cards compared to 3 probe cards prior to the repartition.

Figure 2B:
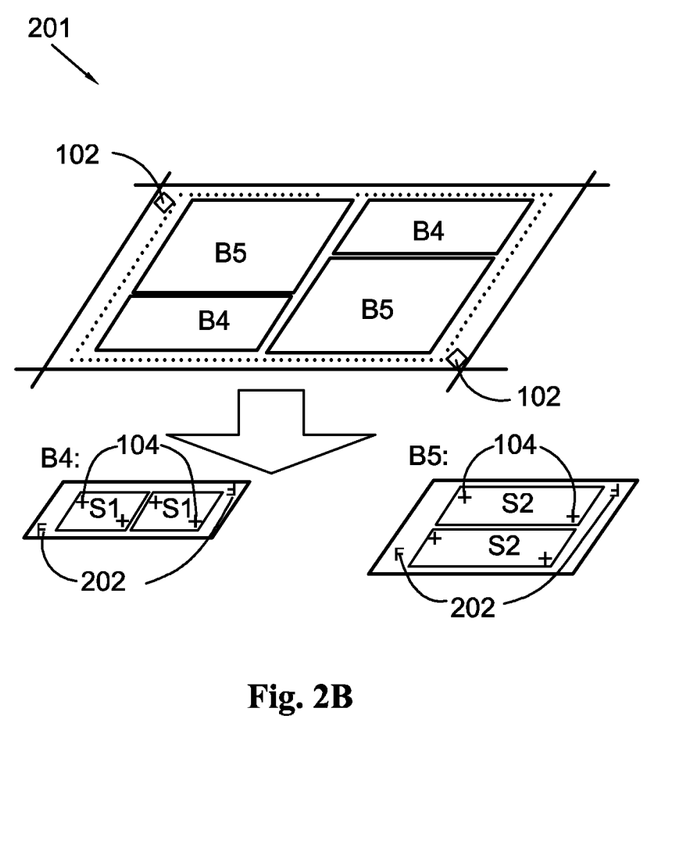
FIG. 2B is a backside probe card partition layout of the integrated circuit die in FIG. 2A repartitioned for probe card reuse according to some embodiments.

FIG. 2B is a backside probe card partition layout of the integrated circuit die in FIG. 2A repartitioned for probe card reuse according to some embodiments. Assuming that the integrated circuit die in FIG. 2A has the backside 201 as shown in FIG. 2B, the backside probe card partition layout is repartitioned using the same sections as the front side repartition in FIG. 2A. For example, each B4 section is divided into two sections S1 and each B5 section is divided into two sections S2. After the repartition using sections S1 and S2, the backside integrated circuit die testing with repartitioned probe card partition layout would have 2 probe cards, 2 times wafer insertion (to the prober equipment), and 8 probing steps (reusing one probe card for the section S1 four times and another probe card for the section S2 four times).

The testing cost for the backside itself is similar with or without repartition because of the same number of probe cards used (2), but since the same probe card partition S1 and S2 that are used for the front side in FIG. 2A are reused for the backside, the total testing cost for both the front side in FIG. 2A and the backside in FIG. 2B is reduced because the repartitioned probe card partition layout only uses 2 probe cards (corresponding to S1 and S2) compared to 3 probe cards (corresponding to B4, B5, and B6) prior to the repartition.

Figure 3A:
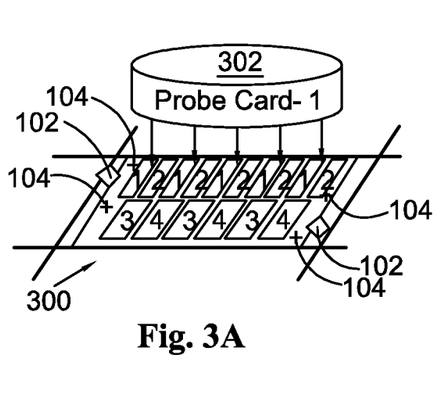
FIGS. 3A-3D are intermediate steps of an exemplary integrated circuit testing with a probe card partition layout having interlaced patterns according to some embodiments.
Figure 3B:
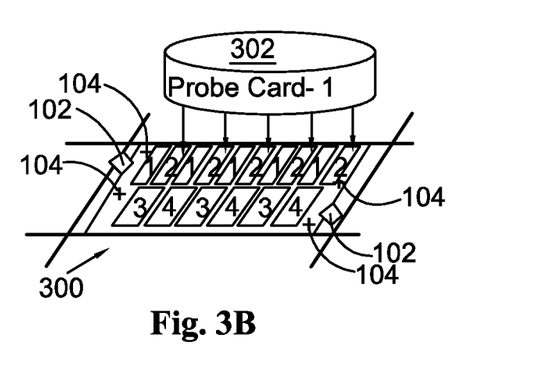

FIG. 3A is the first step of an exemplary integrated circuit testing with a probe card partition layout having interlaced patterns according to some embodiments. A probe card partition layout 300 has section 1 and section 2 interlaced, and section 3 and section 4 interlaced. The die-level alignment marks 102 and section-level alignment marks 104 help aligning probe cards. The probe card 302 for section 1 is used for testing section 1 in the first step. At the second step in FIG. 3B, the same probe card 302 for section 1 is reused for testing section 2. The section 1 and section 2 have the same dimensions and test contact patterns for electrical contact of the probe card 302. Reuse of the probe card 302 for section 1 and section 2 may need dummy pad insertion as described below in FIGS. 4A-4B as an example.

Figure 3C:
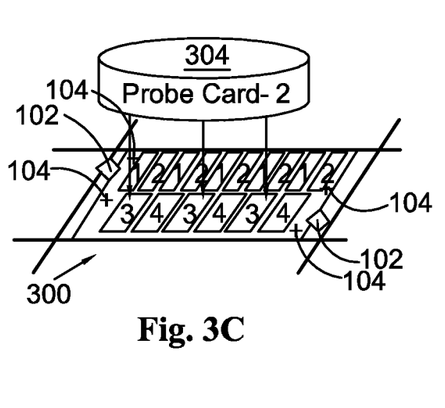
Figure 3D:
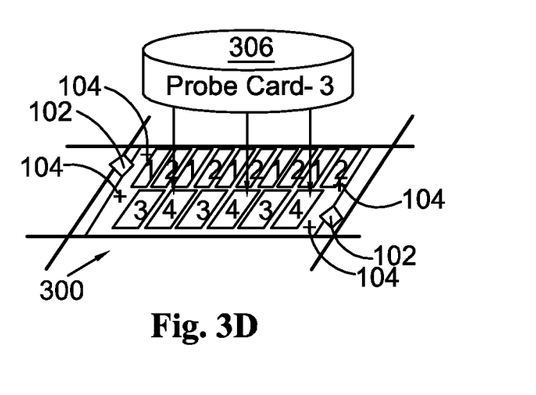

At the third step in FIG. 3C, a different probe card 304 for section 3 is used, because section 3 has different dimensions and/or test contact patterns for electrical contact from section 1 or section 2. At the fourth step in FIG. 3D, a different probe card 306 for section 4 is used, because section 4 has different dimensions and/or test contact patterns for electrical contact from section 1, section 2, and section 3. With the exemplary four-step probe card reuse scheme for testing shown in FIGS. 3A-3D, the testing would have 3 probe cards, 3 wafer insertions (to the prober equipment), and 4 probing steps.

Figure 4A:
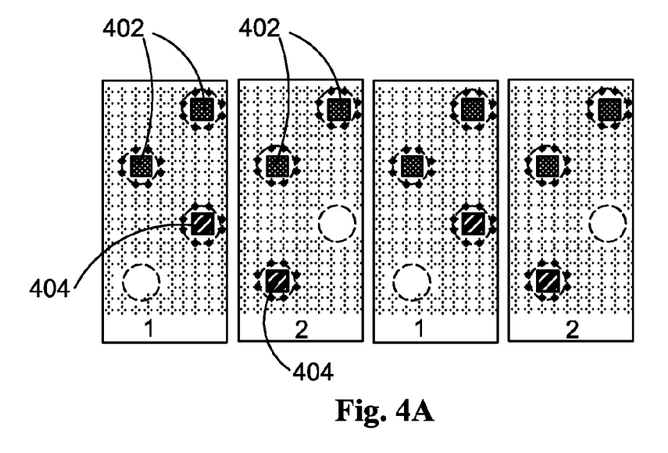
FIG. 4A is an exemplary test contact pattern in a interlaced probe card partition layout according to some embodiments.

FIG. 4A is an exemplary test contact pattern in an interlaced probe card partition layout according to some embodiments. Section 1 and section 2 have the same dimension (size) but different test contact pattern. Pads 402 have common pad locations (within each section) between interlaced section 1 and section 2. Pads 404 have different pad locations (within each section) between interlaced section 1 and section 2. The locations of the pads 404 are compatible for dummy pattern insertion because they don't overlap or interfere with each other.

Figure 4B:
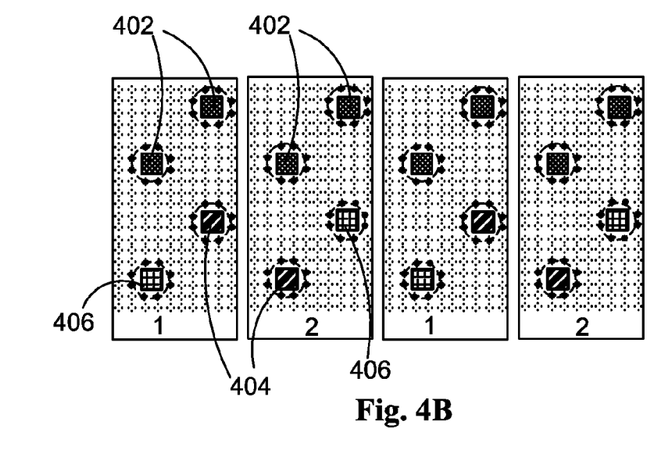
FIG. 4B is the exemplary test contact pattern in FIG. 4A with dummy contact pattern insertion for probe card reuse according to some embodiments.

FIG. 4B is the exemplary test contact pattern in FIG. 4A with dummy contact pattern insertion for probe card reuse according to some embodiments. The pads 402 are the same as the in FIG. 4A. The dummy pads 406 are inserted to have a uniform test contact pattern for section 1 and section 2. A probe card having the same test contact pattern and dimension can be reused for section 1 and section 2 after the dummy pad insertion in the integrated circuit.

Figure 4C:
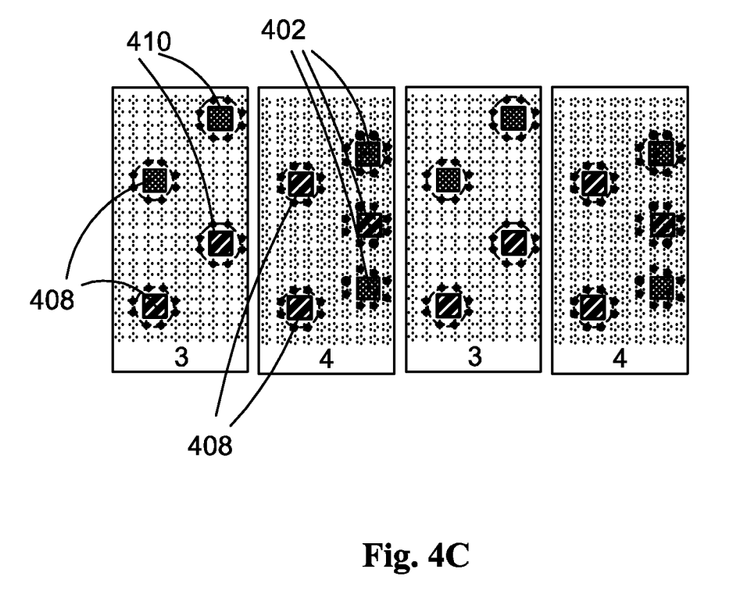
FIG. 4C is another exemplary test contact pattern of an interlaced probe card partition layout where dummy contact pattern insertion is not available.

FIG. 4C is another exemplary test contact pattern of an interlaced probe card partition layout where dummy contact pattern insertion is not available. Pads 408 have common locations (within each section) between interlaced section 3 and section 4. However, pads 410 in the section 3 and pads 412 in the section 4 have conflicting locations that are not compatible for dummy pattern insertion because they overlap or interfere with each other. Therefore, dummy pattern insertion for probe card reuse is not available and different probe cards are used for the section 3 and the section 4.

Figure 5:
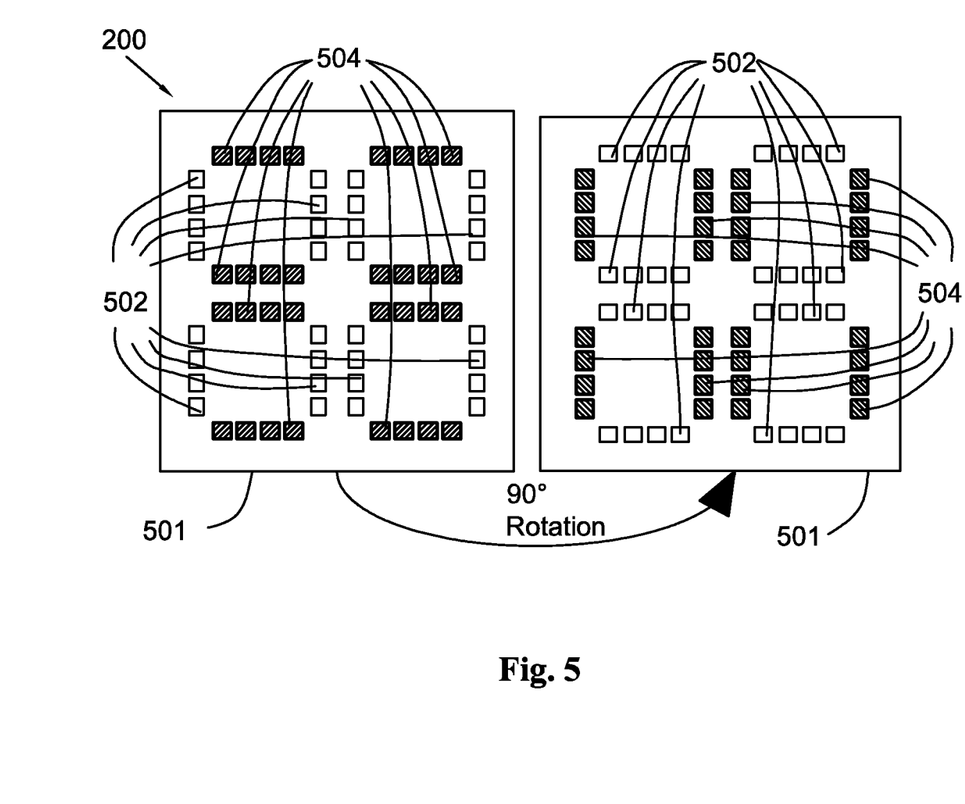
FIG. 5 is an exemplary probe card partition layout having a symmetric test contact pattern with respect to rotation by a given angle according to some embodiments.

FIG. 5 is an exemplary probe card partition layout having a symmetric test contact pattern with respect to rotation by a given angle according to some embodiments. The test contact pattern 500 for the probe card partition layout of an integrated circuit die includes pads (contacts) 502 and pads (contacts) 504. The test contact pattern 500 is arranged into the two contact patterns, for pads 502 and pads 504, respectively, that are symmetric with respect to rotation by 90°.

A probe card having the contact pattern for pads 502 can be used for probing on pads 502, then the integrated circuit die can be rotated by 90° and the same probe card can be reused for probing on pads 504 with the same contact pattern. Therefore, the probe card testing of the test contact pattern 500 with high pin count can be arranged into two contact patterns (e.g., for pads 502 and 504 respectively) having smaller number of pin counts and reusing the same probe cards for both contact patterns with rotation by 90°. In other embodiments, the test contact pattern may be arranged into more than two contact patterns that are symmetrical with respect to rotation by a specified angle, wherein the contact pattern and pin type (e.g., power, ground, signal, etc) remains the same after the rotation.

An aspect of this description relates to a method of testing an integrated circuit die. The method comprises partitioning a first probe card partition layout of the integrated circuit die having one or more sections comprising a first quantity of section types into a second probe card partition layout having a greater quantity of sections comprising a second quantity of section types, the second quantity of section types being less than the first quantity of section types. The method also comprises using one or more probe cards to test the sections in the second probe card partition layout, each of the one or more probe cards having a test contact pattern that corresponds with a test contact pattern of one of each section type included in the second probe card partition layout.

Another aspect of this description relates to a probe card partition layout comprising one or more first sections having a first section type configured to be used with a first probe card having a first test contact pattern. The probe card partition layout also comprises one or more second sections having a second section type configured to be used with a second probe card having a second test contact pattern different from the first test contact pattern of the first probe card. The probe card partition layout further comprises at least one alignment mark. The at least one alignment mark is used for tester alignment.

A further aspect of this description relates to a method of testing an integrated circuit die. The method comprises arranging at least one section of a first probe card partition layout of the integrated circuit die to have at least two contact patterns that are symmetric with respect to rotation by a specified angle. The method also comprises partitioning the first probe card partition layout into a second probe card partition layout having a greater quantity of sections comprising a different quantity and type of contact patterns than the first probe card partition layout. The method further comprises using one or more probe cards to test the sections in the second probe card partition layout, each of the one or more probe cards having a contact pattern that corresponds with the contact patterns included in the second probe card partition layout.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of testing an integrated circuit die, the method comprising:
   partitioning a first probe card partition layout of the integrated circuit die into a second probe card partition layout;
      the first probe card partition layout having one or more sections, each section conforming to a member of a first collection of section types, there being a first quantity of members in the first collection;
      the second probe card partition layout having a greater quantity of sections than the first probe card partition layout, each section in the second probe card partition layout conforming to a member of a second collection of section types, there being a second quantity of members in the second collection;
      the second quantity being less than the first quantity; and
   using one or more probe cards to test the sections in the second probe card partition layout, each of the one or more probe cards having a test contact pattern that corresponds with a test contact pattern of one of each section type represented in the second probe card partition layout.

2. The method of claim 1, wherein the second probe card partition layout has a test contact pattern that is symmetric with respect to rotation by a specified angle.

3. The method of claim 1, further comprising using the same probe card for testing multiple instances of at least one of the one or more different section configurations in the second probe card partition layout.

4. The method of claim 3, wherein the same probe card is used for testing all instances of the one or more different section configurations of the second probe card partition layout.

5. The method of claim 1, wherein, for at least one of the one or more section configurations, the second probe card partition layout has a first set of instances of the given configuration interlaced with a second set of instances of the given configuration.

6. The method of claim 5, further comprising using the same probe card for testing the first and the second set.

7. The method of claim 1, further comprising adding at least one dummy pad in at least one section configuration of the second probe card partition layout.

8. The method of claim 1, wherein a number of test contacts of each of the one or more section configurations of the second probe card partition layout is limited within a tester pin count specification.

9. The method of claim 1, further comprising adding at least one alignment mark to each section configuration of the second probe card partition layout.

10. The method of claim 1, further comprising using at least one section configuration in the second probe card partition layout for a backside probe card partition layout of the integrated circuit die.

11. The method of claim 1, wherein each member type in the second collection of section types is a subset of a corresponding member type in the first collection of section types.

12. A probe card partition layout, comprising:
one or more first sections having a first arrangement of pads corresponding to a first angular position of a probe card having a test contact pattern, the first arrangement being arranged on a reference plane and the first angular position being defined relative to an axis of rotation orthogonal to the reference plane;
one or more second sections having a second arrangement of pads corresponding to a second angular position of the probe card, the second orientation also being arranged on the reference plane, the second angular position being rotationally displaced from the first position such that pads of the first arrangement do not overlap pads of the second arrangement; and
at least one alignment mark, a location of each mark being based on a predetermined spatial relationship with a corresponding at least one of (A) at least one of the one or more first sections or (B) at least one the one or more second sections,
wherein the at least one alignment mark is used for tester alignment.

13. The probe card partition layout of claim 12, wherein the one or more first sections are interlaced with the one or more second sections.

14. The probe card partition layout of claim 12, wherein at least one dummy pad is added to at least one section of the one or more first sections or the one or more second sections.

15. The probe card partition layout of claim 12, wherein the probe card is used for testing a backside of the integrated circuit die.

16. The probe card partition layout of claim 12, wherein a number of test contacts of each section of the probe card partition layout is limited within a tester pin count specification.

* * * * *